US009923547B2

(12) United States Patent
Chen et al.

(10) Patent No.: US 9,923,547 B2
(45) Date of Patent: Mar. 20, 2018

(54) METHOD AND SYSTEM FOR A DISTRIBUTED TRANSMISSION LINE MULTIPLEXER FOR A MULTI-CORE MULTI-MODE VOLTAGE-CONTROLLED OSCILLATOR (VCO)

(71) Applicant: Maxlinear, Inc., Carlsbad, CA (US)

(72) Inventors: Wenjian Chen, Carlsbad, CA (US); Sangeetha Gopalakrishnan, Carlsbad, CA (US); Raghava Manas Bachu, Carlsbad, CA (US); Vamsi Paidi, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

(21) Appl. No.: 15/236,372

(22) Filed: Aug. 12, 2016

(65) Prior Publication Data

US 2017/0047891 A1    Feb. 16, 2017

Related U.S. Application Data

(60) Provisional application No. 62/204,264, filed on Aug. 12, 2015, provisional application No. 62/363,611, filed on Jul. 18, 2016.

(51) Int. Cl.
*H03B 5/12* (2006.01)
*H03H 11/30* (2006.01)
(Continued)

(52) U.S. Cl.
CPC .............. *H03H 11/30* (2013.01); *H03B 1/00* (2013.01); *H03B 5/00* (2013.01); *H03B 5/1237* (2013.01);
(Continued)

(58) Field of Classification Search
CPC ........... H03F 1/0288; H04B 4/00; H03B 5/00; H03B 5/1237; H03B 27/00; H03H 11/30; H03L 7/1974; G01H 5/00
(Continued)

(56) References Cited

U.S. PATENT DOCUMENTS

| 6,785,525 | B2 * | 8/2004 | Ries | ........................ | H03B 21/02 |
|---|---|---|---|---|---|
| | | | | | 331/179 |
| 7,505,749 | B2 * | 3/2009 | Darabi | ................... | H04B 1/406 |
| | | | | | 455/168.1 |

(Continued)

*Primary Examiner* — Arnold Kinkead
(74) *Attorney, Agent, or Firm* — McAndrews, Held & Malloy (57) ABSTRACT

Methods and systems for a distributed transmission line multiplexer for a multi-core multi-mode voltage-controlled oscillator (VCO) may comprise a plurality of voltage controlled oscillators (VCOs) arranged adjacent to each other, where each of the plurality of VCOs are operable to generate an output signal at a configurable frequency, an impedance matching circuit comprising a respective driver and impedance matching elements coupled to each of the plurality of VCOs, and an output device coupled to the impedance matching circuit. The impedance matching elements may include capacitors and inductors. Between each adjacent pair of the respective drivers coupled to each of the plurality of VCOs, the impedance matching elements may include two inductors coupled in series between the drivers and a capacitor coupled to ground and to a common node between the two inductors. Impedance values of the capacitors and inductors may be configurable. The impedance matching elements may include a resistor coupled to a bias voltage VDD and to a common node with a capacitor that is coupled to ground, where the common node is coupled to one of the inductors. The output device may include a prescaler that is an integer or fractional frequency-N divider, or a buffer. The respective drivers coupled to each of the plurality of VCOs (Continued)

may be configured to provide a constant output power no matter which of said plurality of VCOs is enabled.

37 Claims, 7 Drawing Sheets

(51) Int. Cl.
*H03B 1/00* (2006.01)
*H03B 27/00* (2006.01)
*H03B 5/00* (2006.01)
*H03B 25/00* (2006.01)

(52) U.S. Cl.
CPC ............ *H03B 25/00* (2013.01); *H03B 27/00* (2013.01); *H03B 2200/0072* (2013.01)

(58) Field of Classification Search
USPC ............ 331/57, 48, 49, 46, 45, 74; 375/307; 370/276, 290; 333/32
See application file for complete search history.

(56) References Cited

U.S. PATENT DOCUMENTS

| | | | |
|---|---|---|---|
| 2010/0066450 A1* | 3/2010 | Palmer | H03F 3/45179 330/261 |
| 2013/0187712 A1* | 7/2013 | Cabanillas | H03H 7/40 330/192 |

* cited by examiner

METHOD AND SYSTEM FOR A DISTRIBUTED TRANSMISSION LINE MULTIPLEXER FOR A MULTI-CORE MULTI-MODE VOLTAGE-CONTROLLED OSCILLATOR (VCO)

CLAIM OF PRIORITY

This patent application makes reference to, claims priority to and claims benefit from the U.S. Provisional Patent Application Ser. No. 62/204,264 filed on Aug. 12, 2015, and entitled "METHOD AND SYSTEM FOR A DISTRIBUTED TRANSMISSION LINE MULTIPLEXER FOR A MULTI-CORE MULTI-MODE VOLTAGE-CONTROLLED-OSCILLATOR (VCO)," and U.S. Provisional Patent Application Ser. No. 62/363,611 filed on Jul. 18, 2016 and entitled "METHOD AND SYSTEM FOR HIGH FREQUENCY SIGNAL SELECTION."

Each of the above stated applications is hereby incorporated herein by reference in its entirety.

TECHNICAL FIELD

Aspects of the present application relate to communications. More specifically, certain embodiments of the disclosure relate to a method and a system for a distributed transmission line multiplexer for a multi-core multi-mode voltage-controlled oscillator (VCO).

BACKGROUND

Existing methods and systems for voltage-controlled-oscillator (VCO) can introduce disturbances and/or handle such disturbances in an inefficient manner. In this regard, communication via wireless and/or wired connections may comprise reception and/or transmission of radio frequency (RF) signals. For example, communication devices may transmit and/or receive RF signals carrying exchanged data, with the RF signals being configured in accordance with corresponding wired and/or wireless protocols or standards. Accordingly, signal processing (e.g., of RF signals) must be performed during wireless and/or wired communications to enable proper exchange of information. Example signal processing operations may comprise filtering, amplification, up-conversion/down-conversion of baseband signals, modulation/demodulation, analog-to-digital conversions and digital-to-analog conversions, encoding/decoding, and/or encryption/decryption.

Further limitations and disadvantages of conventional and traditional approaches will become apparent to one of skill in the art, through comparison of such approaches with some aspects of the present method and apparatus set forth in the remainder of this disclosure with reference to the drawings.

BRIEF SUMMARY

A system and/or method is provided for a distributed transmission line multiplexer for a multi-core multi-mode voltage-controlled oscillator (VCO), substantially as shown in and/or described in connection with at least one of the figures, as set forth more completely in the claims.

These and other advantages, aspects and novel features of the present disclosure, as well as details of illustrated implementation(s) thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first plurality of lines of code and may comprise a second "circuit" when executing a second plurality of lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be performed by one or more circuits. As utilized herein, the term "example" means serving as a non-limiting example, instance, or illustration. As utilized herein, the terms "for example" and "e.g.," introduce a list of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Certain implementations of the disclosure may be found in a method and system for a distributed transmission line multiplexer for a multi-core multi-mode voltage-controlled oscillator (VCO). Exemplary aspects of the disclosure may comprise a plurality of voltage controlled oscillators (VCOs) arranged adjacent to each other, where each of the plurality of VCOs are operable to generate an output signal at a configurable frequency, an impedance matching circuit comprising a respective driver and impedance matching elements coupled to each of the plurality of VCOs, and an output device coupled to the impedance matching circuit. The impedance matching elements may include capacitors and inductors. Between each adjacent pair of the respective drivers coupled to each of the plurality of VCOs, the impedance matching elements may include two inductors coupled in series between the drivers and a capacitor coupled to ground and to a common node between the two inductors. Impedance values of the capacitors and inductors may be configurable. The impedance matching elements may include a resistor coupled to a bias voltage VDD and to a common node with a capacitor that is coupled to ground, where the common node is coupled to one of the inductors. The output device may include a prescaler that is an integer or fractional frequency-N divider, or a buffer. The respective drivers coupled to each of the plurality of VCOs may be configured to provide a constant output power no matter which of said plurality of VCOs is enabled.

Figure 1:
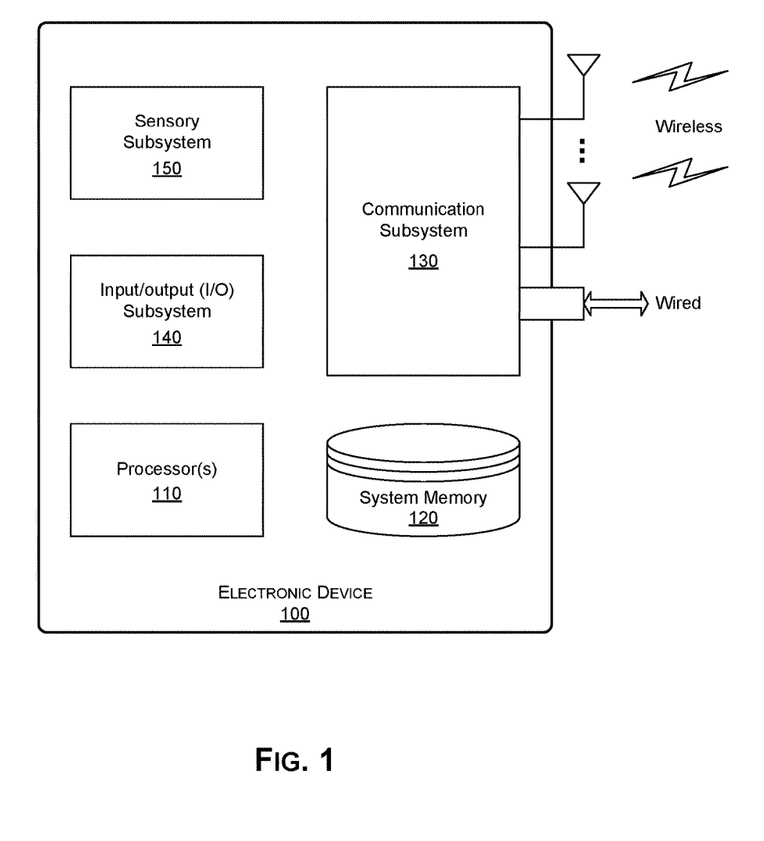
FIG. 1 illustrates an example electronic device that may utilize a voltage-controlled-oscillator (VCO) in accordance with various implementations of the disclosure.

FIG. 1 illustrates an example electronic device that may utilize a voltage-controlled-oscillator (VCO) in accordance with various implementations of the disclosure. Referring to FIG. 1, there is shown an electronic device 100.

The electronic device 100 may comprise suitable circuitry, interfaces, logic, and/or code for implementing various aspects of the disclosures. In this regard, the electronic device 100 the electronic device may be configured to support performing, executing or running various operations, functions, applications and/or services. For example, the electronic device 100 may be operable to support, in some instances, such operations as communication operations, processing or handling of data, input/output operations, or the like. In this regard, the electronic device 100 may enable and/or support communication of data, such as via wired and/or wireless connections, which may be configured in accordance with one or more supported wireless and/or wired protocols or standards. To support input/output operations, the electronic device 100 may comprise components or subsystems for enabling interactions with a user (e.g., end-user or installer), so as to obtain user input and/or to provide user output. In some instances, the electronic device 100 may be a handheld mobile device—i.e., be intended for use on the move and/or at different locations. In this regard, the electronic device 100 may be designed and/or configured to allow for ease of movement, such as to allow it to be readily moved while being held by the user as the user moves, and the electronic device 100 may be configured to perform at least some of the operations, functions, applications and/or services supported by the device on the move. Examples of electronic devices may comprise set-top boxes, televisions, displays, gateways, modems, access points, femtocells, computers, cellular phones, smartphones, tablets, and or any other network node. The disclosure, however, is not limited to any particular type of electronic device.

The electronic device 100 may comprise, for example, one or more processors 110, a system memory 120, a communication subsystem 130, an input/output (I/O) subsystem 140, and a sensory subsystem 150.

The processor 110 may comprise suitable circuitry, interfaces, logic, and/or code that may be operable to perform general and/or specialized processing operations in the electronic device 110. For example, the processor 110 may comprise a general purpose processor (e.g., a central processing unit or CPU), a special purpose processor (e.g., graphics processing unit or GPU, or a visual processing unit or VPU), or the like. The disclosure, however, is not limited to any particular type of processor. When utilized as a general purpose processor, the processor 110 may be operable to, for example, process or handle data, control or manage operations of the electronic device 100, and/or handle or support tasks and/or applications performed therein. In this regard, the processor 110 may be utilized to configure and/or control operations of various components and/or subsystems of the electronic device 100, by utilizing, for example, one or more control signals. In some instances, however, the processor 110 may comprise a specialized processor, such as a video/graphics processor or a dedicated application processor that may be utilized for running and/or executing applications (or programs) in the electronic device 100.

The system memory 120 may comprise suitable circuitry, interfaces, logic, and/or code that may enable permanent and/or non-permanent storage, buffering, and/or fetching of data, code and/or other information, which may be used, consumed and/or processed. In this regard, the system memory 120 may comprise different memory technologies, including, for example, read-only memory (ROM), random access memory (RAM), Flash memory, solid-state drive (SSD), and/or field-programmable gate array (FPGA). The disclosure, however, is not limited to any particular type of memory or storage device. The system memory 120 may store, for example, configuration data, which may comprise parameters and/or code, comprising software and/or firmware. The disclosure is not limited, however, to any particular type of configuration data.

The communication subsystem 130 may comprise suitable circuitry, interfaces, logic, and/or code operable to communicate data from and/or to the electronic device, such as via one or more wired and/or wireless connections. The communication subsystem 130 may be configured to support one or more wired protocols and/or interfaces, and/or one or more wireless protocols and/or interfaces, facilitating transmission and/or reception of signals to and/or from the electronic device 100 and/or processing of transmitted or received signals in accordance with applicable wired or wireless protocols. Examples of wireless protocols or standards that may be supported and/or used by the communication subsystem 130 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 1G/2G+(e.g., GSM/GPRS/EDGE, and IS-95 or cdmaOne) and/or 1G/2G+ (e.g., CDMA2000, UMTS, and HSPA); 4G standards, such as WiMAX (IEEE 802.16) and LTE; Ultra-Wideband (UWB), and/or the like. Examples of wired protocols and/or interfaces that may be supported and/or used by the communication subsystem 130 comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the communication subsystem 130 comprise, for example, filtering, amplification, analog-to-digital conversion and/or digital-to-analog conversion, up-conversion/down-conversion of baseband signals, encoding/decoding, encryption/decryption, and/or modulation/demodulation.

The I/O subsystem 140 may comprise suitable circuitry, interfaces, logic, and/or code for enabling and/or managing user (e.g., end-user or installer) interactions with the electronic device 100, such as obtaining input from, and/or to providing output to, the device user(s). The I/O subsystem 140 may support various types of inputs and/or outputs, including, for example, video, audio, and/or text. In this regard, dedicated I/O devices and/or components, external to (and coupled with) or integrated within the electronic device 100, may be utilized for inputting and/or outputting data during operations of the I/O subsystem 140. Examples of such dedicated I/O devices may comprise displays, audio I/O components (e.g., speakers and/or microphones), mice, keyboards, touch screens (or touchpads), and the like. In some instances, user input obtained via the I/O subsystem 140, may be used to configure and/or modify various functions of particular components or subsystems of the electronic device 100.

The sensory subsystem 150 may comprise suitable circuitry, interfaces, logic, and/or code for obtaining and/or generating sensory information, which may relate to the electronic device 100, its user(s), and/or its environment. For example, the sensory subsystem 150 may comprise ambient conditions (e.g., temperature, humidity, or light) sensors, positional or location sensors (e.g., GPS or other GNSS based sensors), and/or motion related sensors (e.g., accelerometer, gyroscope, pedometers, and/or altimeters).

In operation, the electronic device 100 may be utilized (e.g., by a user) to perform, execute and/or run various operations, functions, applications or services, such as using pre-configured instructions and/or based on real-time user instructions or interactions. In this regard, various types of operations, functions, applications or services may be available in or supported by the electronic device 100. For example, the electronic device 100 may be used for executing programs, playing video and/or audio content, gaming, email applications (and/or similar type of web based communications), calling services (e.g., voice calls), networking services (e.g., WiFi hotspot, Bluetooth piconet, and/or active 3G/femtocell data channels), or the like. The disclosure, however, is not limited to any particular type of operations, functions, applications or services.

In some instances, operations performed by the electronic device 100 may sometimes require generation of signals with particular characteristics, such as frequencies. For example, the electronic device 100 may be utilized in communication of data, such as using available wireless or wired connections. In this regard, data may be communicated using radio frequency (RF) signals, which may be communicated to and/or from the electronic device 100 over supported wired or wireless interfaces. Processing signals in the electronic device 100 may be performed using suitable components or circuits (e.g., in the communication subsystem 130), in which signals may be generated for use as baseband signals or carrier signals for example. The electronic device 100 may also be utilized in generating audio signals (e.g., for output via speakers), such as based on digital audio content obtained from local sources (storage media), remote sources (e.g., broadcast nodes), or user input (e.g., clicks corresponding to interactions with touchscreen). Various methods may be used in generating signals required by the electronic device 100. For example, one of the more common methods for generating signals (e.g., for use in signal processing) may be using oscillator circuits. In this regard, oscillator circuits may be operable to produces repetitive, oscillating electronic signal (e.g., a sine wave) based on some form of input (e.g., voltage). Signal generation in the electronic device 100 may, in some instances, entail or comprise frequency synthesis. In this regard, frequency synthesis may comprise generating various ranges of frequencies from a single fixed source (e.g., oscillator). Frequency synthesis may be used in such systems or applications as, for example, communications (e.g., radio receivers, mobile telephones, radiotelephones, walkie-talkies, satellite receivers, navigational systems, etc.), audio processing or the like. Frequency synthesis may comprise such operations as frequency multiplication, frequency division, and frequency mixing (the frequency mixing process generates sum and difference frequencies) operations to produce the desired output signal.

In example implementation, the electronic device 100 may incorporate a plurality of phase-locked loop (PLL) circuits, for use in signal generation related operations. In this regard, a PLL may be operable to generate output signal(s) whose phase may be related to the phase of an input (reference) signal. PLL circuits may typically comprise some sort of variable frequency oscillator (e.g., voltage controlled oscillator or VCO) and a phase detector, with the phase detector being utilized to compare the phase of the reference signal with the phase of the signal derived from the output of the oscillator (e.g., to enable determining necessary adjustments to the frequency of its oscillator to keep the phases matched). The signal from the phase detector may then be used to control the oscillator in a feedback loop manner. Because frequency relates to phase (e.g., frequency is the time derivative of phase), keeping the input and output phase locked may allow keeping the input and output frequencies in lock as well. Consequently, PLLs may be utilized to track input frequencies, and/or to generate output frequencies related thereto (a frequency that is a multiple of an input frequency). Such frequency control may be utilized in various processing operations, such as demodulation, frequency synthesis, and the like. PLLs are widely employed in radio, communications, computers and other electronic applications. In this regard, PLLs may be utilized to enable recovering signals from a noisy communication channel, generate stable frequencies at a multiple of an input frequency (frequency synthesis), or distribute clock timing pulses various circuits or systems (e.g., microprocessors, such as the processors 110).

Signal generation (e.g., using PLL circuits) may be subject, in some instances, to disturbances, such as due to particular conditions that may affect the signal generation. In this regard, conditions that may affect signal generation may comprise environmental conditions (e.g., temperature), physical conditions (e.g., movement, rotation or shaking of system incorporating the signal generator), functional conditions—i.e., conditions relating directly to the signal generation (e.g., supply variations), and/or the like. The disclosure, however, is not limited to any particular type of conditions. Accordingly, in various implementations of the disclosure, an enhanced architecture may be utilized in implementing components (e.g., PLLs) used in generation of signals in electronic devices, such as the electronic device 100. In this regard, such an enhanced architecture may enable expedited modification when changing output signals, and/or providing adaptive and dynamic tuning, to ensure that an output signal may be maintained when there may be change in conditions affecting signal generation (e.g., change in temperature, which may be detected using the sensory subsystem 150 for example, voltage/supply variations, etc.). In addition, VCO architecture may be configured to mitigate the effect of noise generated from large voltage swings on the multiple VCO's that may be utilized in a multi-standard and/or multi-frequency system.

The plurality of oscillators, mentioned above, may be physically separated yet have to deliver power to a single place, running at very high frequencies with associated parasitic losses. In an example scenario, a distributed transmission line, or traveling wave, multiplexer may be utilized to couple the multiple VCO cores. Impedance matching circuitry comprising resistors, capacitors, inductors, and buffers, enable matched impedances in each direction, and therefore high bandwidth multiplexing of multiple VCOs with low power.

Figure 2:
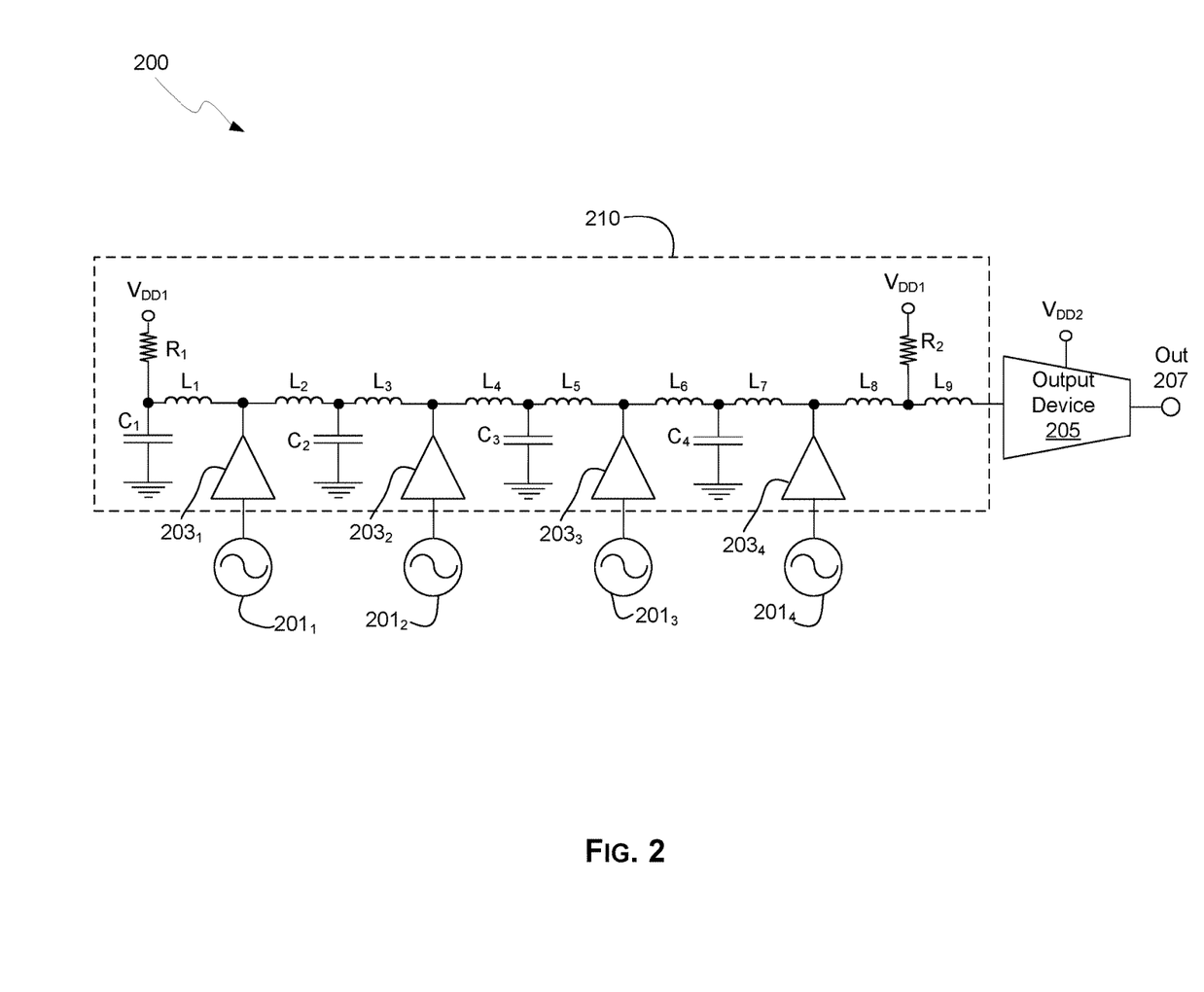
FIG. 2 is a block diagram illustrating an example a distributed transmission line multiplexer for a multi-core multi-mode voltage-controlled-oscillator (VCO), which may be used in accordance with various implementations of the disclosure.

FIG. 2 illustrates an example distributed transmission line multiplexer for a multi-core multi-mode voltage-controlled oscillator (VCO), which may be used in accordance with various implementations of the disclosure. Referring to FIG. 2, there is shown a multi-core VCO 200 comprising four VCOs $201_1$-$201_4$ with impedance matching circuitry 210 comprising buffers, or drivers $203_1$-$203_4$, inductors L1-L9, capacitors C1-C4, and resistors R1/R2. There is also shown an output device 205 with a supply voltage $VDD_2$ and an output 207.

The VCOs $201_1$-$201_4$ may comprise circuitry that generates an oscillating output signal at a frequency that may be proportional to an input voltage to the VCO. Therefore, four oscillator signals may be generated by the circuit shown in FIG. 2, although the disclosure is not so limited. Accordingly, any number of VCOs may be interconnected and configured based on power requirements, number of desired output frequencies, and chip space, for example.

The impedance matching circuitry 210 may comprise a synthetic transmission line structure in a discrete lumped-element configuration, where discrete components may be incorporated along the length of the structure, matching the impedance to the drivers $203_1$-$203_4$ and the output device 205, for example. In a transmission line, the high frequency of the signals that travel through it causes the wave nature of the signals to be relevant. The inductors L1-L9 may therefore comprise loop inductance coils, wire segments, waveguides, striplines, or microstrips, for example. The capacitors C1-C4 may comprise parallel plate or CMOS transistor capacitors, for example.

The buffers $203_1$-$203_4$ may receive output clock signals from the VCOs $201_1$-$201_4$ and provide a desired output current to the impedance matching elements comprising the inductors L1-L9 and capacitors C1-C4. The output current of the drivers $203_1$-$203_4$ may be configurable such that constant output power is provided no matter which VCO $201_1$-$201_4$ is enabled. In another example scenario, different output levels may be configured for different VCOs $201_1$-$201_4$. The drivers $203_1$-$203_4$ may have a constant output capacitance matched to the impedance matching network comprising the resistors R1, R2, inductors L1-L9, and capacitors C1-C4.

The output device 205 may comprise a buffer, or frequency divider for providing an output signal at a frequency $F_{VCO}$/N where $F_{VCO}$ is the frequency of a given VCO $201_1$-$201_4$ and N is an integer. In an alternative scenario, a fractional-N divider may be utilized for non-integer frequency division. Although a prescaler is described for output device 205 of FIG. 2, the disclosure is not so limited, as buffers may be coupled instead, as shown in FIGS. 3-6.

Impedance matching between each of the sections defined by a VCO $201_1$-$201_4$ may enable highly efficient coupling of the output signals of the VCOs $201_1$-$201_4$ to the output device 205 or other receiving circuitry. Impedance matching may be configured using the inductors L1-L9, the capacitors C1-C4, and the resistors R1/R2, although the number of elements may be increased based on the number of VCOs, for example. The inductors L1-L9 and capacitors C1-C4 may comprise variable impedances or may comprise fixed values. In general, as the desired frequency is increased, the impedance values are reduced.

In an example scenario, due to the impedance matching between each VCO $201_1$-$201_4$, when one VCO $201_1$-$201_4$ powers down and another powers up, the output signal to the prescaler does not show large noise spikes or voltage shifts. The bias voltages $V_{DD}$ may be in the range of 1.3-1.5 V, for example, and the VCOs $201_1$-$201_4$ may generate signals in the 5-20 GHz range or higher, for example, although the disclosure is not so limited. Adjacent VCOs $201_1$-$201_4$ may cover frequency regions that overlap slightly to provide complete coverage over a desired frequency range. The impedance matched multiplexer 200 may exhibit very high bandwidth, operating from DC to tens of GHz, for example, depending on the impedance values and VCO capability.

The transmission line, or traveling wave, MUX provides a broadband muxing solution with a reduced area footprint. In an example scenario, the VCOs $201_1$-$201_4$ may each be spaced 450 μm apart with a distance to the inductors L1-L8 of approximately 800 μm. Each VCO $201_1$-$201_4$ may generate signals at different frequency ranges.

The multiple oscillators, VCOs $201_1$-$201_4$, may be physically separated yet deliver power to a single place, such as to the output device 205, while running at very high frequencies with associated parasitic losses. In an example scenario, a distributed transmission line multiplexer 200 comprising the inductors L1-L9, capacitors C1-C4, and buffers $203_1$-$203_4$ may be utilized to couple the multiple VCO cores with matched impedances in each direction, i.e. the impedance looking in either direction from a given buffer is equal.

The N:1 multiplexing of the VCOs $201_1$-$201_4$ is enabled by switching individual drivers $203_1$-$203_4$ off and on depending on the desired frequency. The drivers $203_1$-$203_4$ may exhibit the same output impedance whether an output current is being provided or not, so is impedance matched to the synthetic transmission line in either mode.

Figure 3:
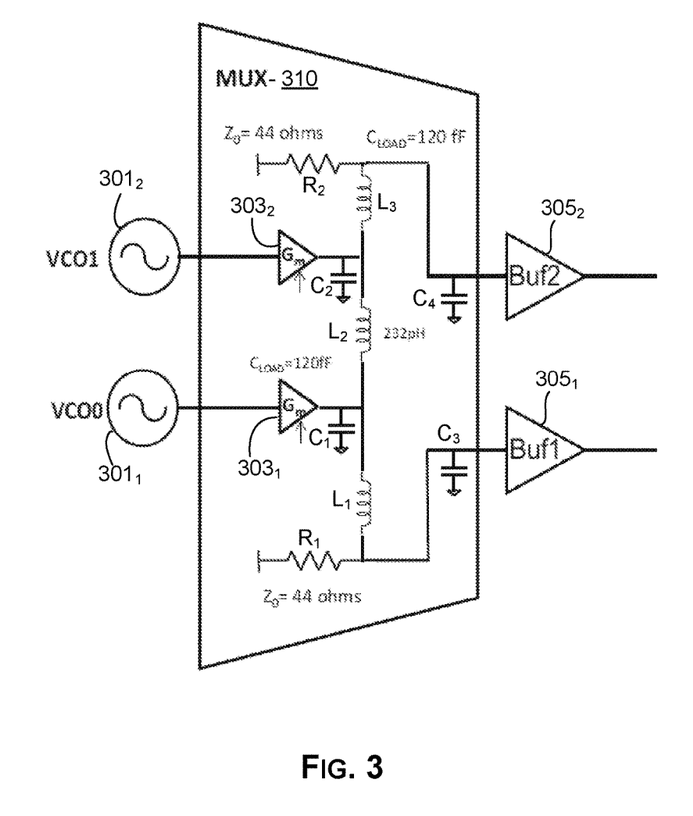
FIG. 3 shows an exemplary oscillator multiplexer, which may be used in accordance with various implementations of the disclosure.

FIG. 3 shows an exemplary oscillator multiplexer, which may be used in accordance with various implementations of the disclosure. This high frequency travelling wave mux 310 comprises two inputs and two outputs and covers a very high frequency bandwidth. In FIG. 3, one voltage controlled oscillator (VCO) frequency is selected and can be muxed out to two outputs. FIG. 3 is a system comprising two oscillators $301_1$ and $301_2$, an exemplary oscillator multiplexer 310, and two buffers $305_1$ and $305_2$.

The example oscillator multiplexer 310 in FIG. 3 comprises two drivers $303_1$ and $303_2$, three inductors $L_1$-$L_3$ (or comparable inductive elements), and two resistive loads $R_1$ and $R_2$. Each oscillator $301_1$ and $301_2$ may be operably coupled to each driver input. Each driver output is operably coupled, via an inductor, to a resistive load $R_1$ and $R_2$ and an input to one or both buffers $305_1$ and $305_2$. The two driver outputs are operably coupled via another inductor. In addition, capacitors C1 and C2 at the outputs of the drivers $303_1$ and $303_2$ are also coupled to ground.

The VCO frequency may be selected by enabling the current to the corresponding driver $303_1$ and $303_2$. The MUX 310 may be implemented using a transmission line load which can have a very high bandwidth. For example, if the drivers $303_1$ and $303_2$ and buffers $305_1$ and $305_2$ each contribute a capacitive load of 120 fF and the inductors are 232 pH the resistive load (R) is sqrt(L/C)=sqrt (232 pH/120 fF)=44 ohm. A characteristic impedance of the synthetic transmission line of 44 ohm could damp the resonance frequency (F), which is 1/(2*pi*sqrt(L*C))=30 GHz. Using these example values, the maximum input VCO frequencies may be based on the resonance frequency. While example impedance values are shown in FIG. 3, the disclosure is not so limited, as impedance values may be configured depending on the frequency of operation and impedances of circuitry receiving the oscillator signal.

Figure 4:
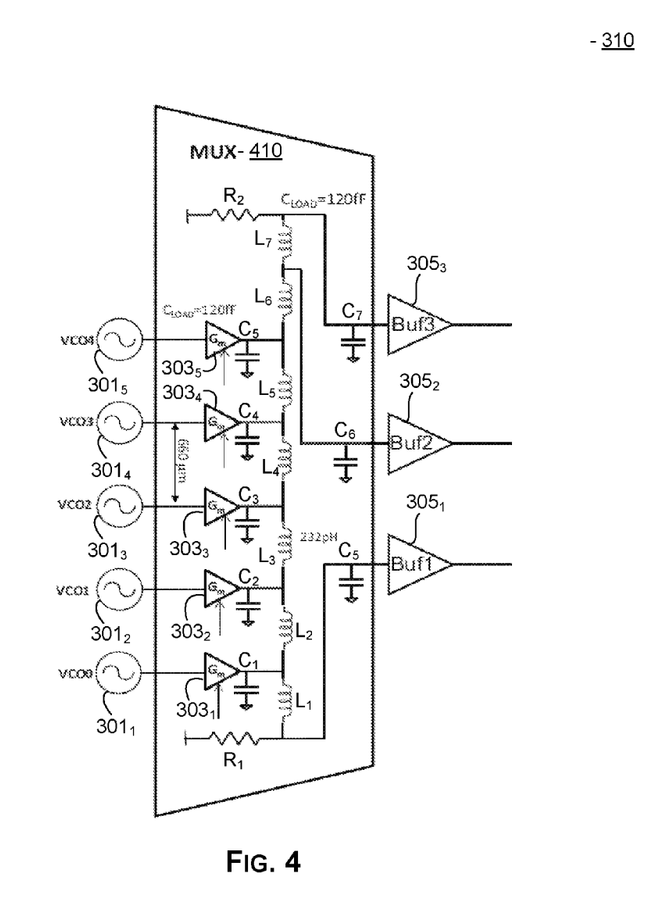
FIG. 4 shows another exemplary oscillator multiplexer, which may be used in accordance with various implementations of the disclosure.

FIG. 4 shows another exemplary oscillator multiplexer, which may be used in accordance with various implementations of the disclosure. This high frequency travelling wave mux 410 comprises five inputs and three outputs and covers a very high frequency bandwidth. In FIG. 4, one voltage controlled oscillator (VCO) frequency may be selected and muxed out to three outputs. FIG. 4 is a system comprising five oscillators $301_1$-$301_5$, an exemplary oscillator multiplexer 410, and three buffers $305_1$-$305_3$.

The exemplary oscillator multiplexer 410 in FIG. 4 comprises five drivers $303_1$-$303_5$, seven inductors $L_1$-$L_7$, and two resistive loads $R_1$ and $R_2$. Each oscillator $301_1$-$301_5$ may be operably coupled to each driver input. The output of a first driver, on the bottom, is operably coupled, via a first inductor, to a first resistive load and a first buffer input. The output of the first driver $303_1$ may also be operably coupled, via a second inductor $L_2$, to the output of another driver $303_2$. The output of the driver $303_2$ may also be operably coupled, via a third inductor $L_3$, to the output of third driver $303_3$. The output of the third driver $303_3$ may also be operably coupled, via a fourth inductor $L_4$, to the output of fourth driver $303_4$. The output of the fourth driver $303_4$ may also be operably coupled, via a fifth inductor $L_5$, to the output of fifth driver $303_5$. The output of the fifth driver $303_5$ may also be operably coupled, via a sixth inductor $L_6$, to the input of second buffer $305_2$. The input of second buffer $305_2$ may also be operably coupled, via seventh inductor $L_7$, to the input of third buffer $305_3$ and to a second resistive load $R_2$.

In the multiplexer of FIG. 4, the signal path from VCO1 $301_2$ to Buf1 $305_1$ is longer than the signal path from VCO1 $301_2$ to Buf2 $305_2$. Also, the signal path from VCO1 $301_2$ to Buf1 $305_1$ is longer than the signal path from VCO0 $301_1$ to Buf1 $305_1$. As a result of the path length difference, the phase of VCO1 $301_2$ at Buf1 $305_1$ may be shifted with respect to the phase of VCO0 $301_1$ at Buf1 $305_1$.

Figure 5:
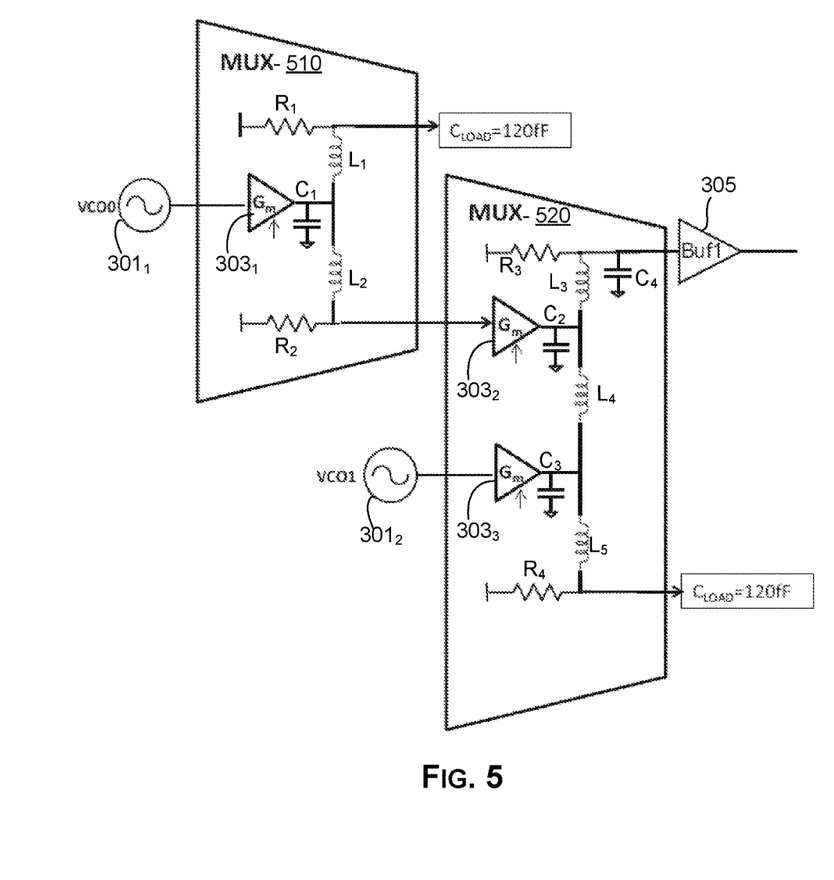
FIG. 5 shows an example of using two oscillator multiplexers in series, which may be used in accordance with various implementations of the disclosure.

FIG. 5 shows example of using two oscillator multiplexers in series, which may be used in accordance with various implementations of the disclosure. In FIG. 5, the phase of VCO1 $301_2$ at Buf1 305 may stay aligned with the phase of VCO0 $301_1$ at Buf1 305 since the signal path from VCO1 $301_2$ to Buf1 305 is the same length as the signal path from VCO0 $301_1$ to Buf1 305. If an output of the multiplexer 510 and/or 520 is not connected to a buffer, an equivalent capacitive load may be connected.

Figure 6:
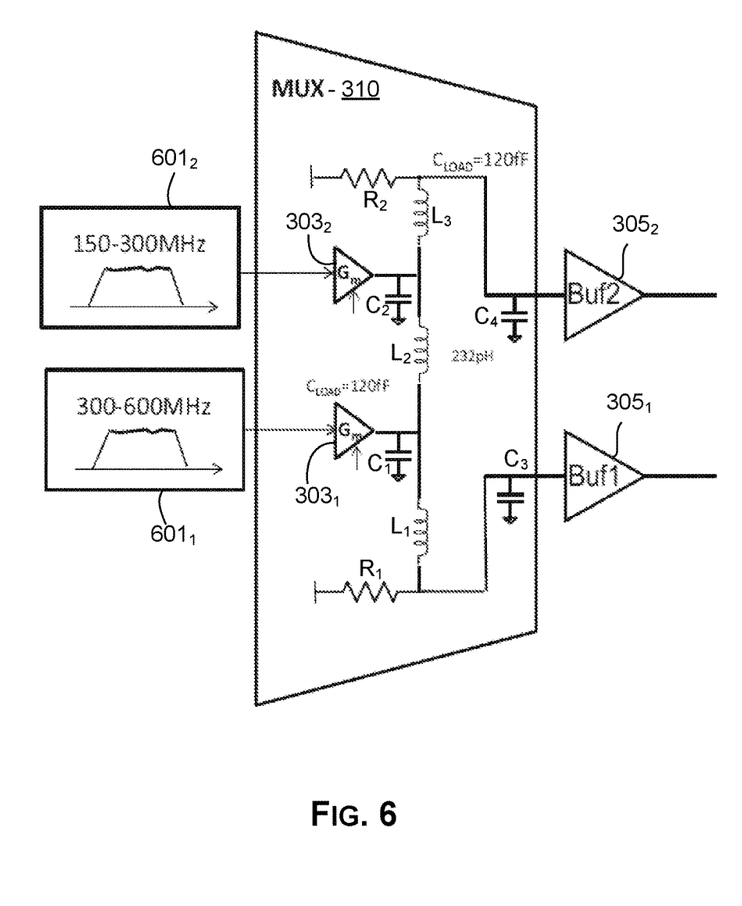
FIG. 6 shows an example of inputting a spectrum signal to a multiplexer, in accordance with various implementations of the disclosure.

FIG. 6 shows an example of inputting a spectrum signal to a multiplexer, in accordance with various implementations of the disclosure. In FIG. 6, either the driver to the 150-300 MHz signal $601_2$ or the driver to the 300-600 MHz signal $601_1$ may be enabled, thereby providing either the 150-300 MHz signal or the 300-600 MHz signal at Buf1 $305_1$ and Buf2 $305_2$. Alternatively in FIG. 6, the driver $303_2$ to the 150-300 MHz signal $601_2$ and the driver $303_1$ to the 300-600 MHz signal $601_1$ may be enabled, thereby providing a combined 150-600 MHz signal at Buf1 $305_1$ and Buf2 $305_2$. Also, note that aspects of FIG. 2-5 may be incorporated into FIG. 6. For example, as described regarding FIG. 4, more than two spectrum signals and/or tones may be combined or selected and more than two buffer outputs may be made available. For example, as described regarding FIG. 5, delay compensation may be achieved by cascading multiplexers and buffer outputs that are not required may be terminated.

Figure 7:
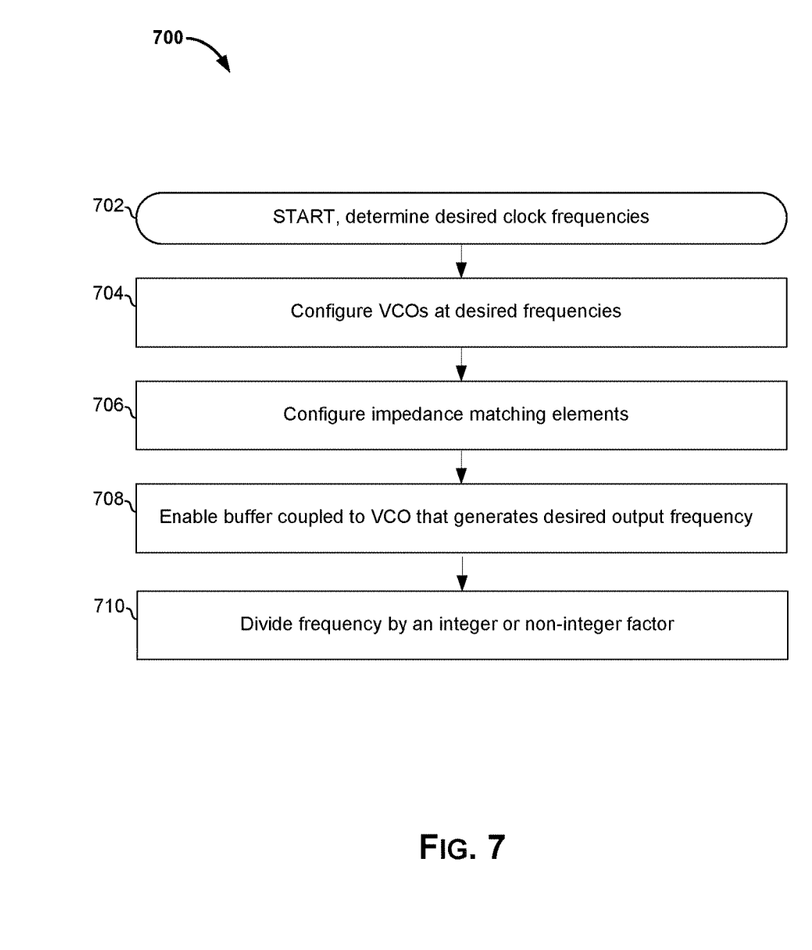
FIG. 7 illustrates a flowchart of an example process for multiplexing VCO signals, in accordance with an example embodiment of the disclosure.

FIG. 7 illustrates a flowchart of an example process for multiplexing VCO signals, in accordance with an example embodiment of the disclosure. Shown in FIG. 7 is flow chart 700, comprising a plurality of example steps (represented as blocks 702-710), which may be performed in a suitable system (e.g., electronic device 100 of FIG. 1, and multi-core VCOs of FIGS. 2-6) to generate clock signals utilizing a plurality of impedance matched VCOs.

In start step 702, desired clock frequencies may be determined (e.g., depending on the communication standards being used, etc.).

In step 704, a plurality of VCOs may be configured at the various desired frequencies.

In step 706, impedance matching elements may be configured so that the impedance of the VCO and associated buffer are matched to a prescaler or buffer coupled to the matching circuitry.

In step 708, the buffer coupled to the VCO at the desired frequency may be enabled to pass the desired frequency to the prescaler and in step 710, the frequency may be divided by an integer or non-integer factor, resulting in an output signal at a desired frequency for communication purposes, for example.

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a distributed transmission line multiplexer for a multi-core multi-mode voltage-controlled oscillator (VCO).

Accordingly, the present method and/or system may be realized in hardware, software, or a combination of hardware and software. The present method and/or system may be realized in a centralized fashion in at least one computer system, or in a distributed fashion where different elements are spread across several interconnected computer systems. Any kind of computer system or other system adapted for carrying out the methods described herein is suited. A typical combination of hardware and software may be a general-purpose computer system with a computer program that, when being loaded and executed, controls the computer system such that it carries out the methods described herein.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or apparatus has been described with reference to certain implementations, it will be understood by those skilled in the art that various changes may be made and equivalents may be substituted without departing from the scope of the present method and/or apparatus. In addition, many modifications may be made to adapt a particular situation or material to the teachings of the present disclosure without departing from its scope. Therefore, it is intended that the present method and/or apparatus not be limited to the particular implementations disclosed, but that the present method and/or apparatus will include all implementations falling within the scope of the appended claims.

What is claimed is:

1. A system, comprising:
    a plurality of voltage controlled oscillators (VCOs) arranged adjacent to each other, each of said plurality of VCOs being operable to generate an output signal at a configurable frequency;
    an impedance matching circuit comprising a respective driver and impedance matching elements coupled to each of the plurality of VCOs; and
    an output device coupled to the impedance matching circuit, wherein said output device comprises a prescaler that is an integer or fractional frequency-N divider and wherein said respective drivers coupled to each of the plurality of VCOs are configured to provide a constant output power no matter which of said plurality of VCOs is enabled.

2. The system of claim 1, wherein said impedance matching elements comprise capacitors and inductors.

3. The system of claim 2, wherein between each adjacent pair of said respective drivers coupled to each of the plurality of VCOs, the impedance matching elements comprise two inductors coupled in series between the drivers and a capacitor coupled to ground and to a common node between the two inductors.

4. The system of claim 2, wherein impedance values of said capacitors and inductors are configurable.

5. The system of claim 2, wherein said impedance matching elements comprise a resistor coupled to a bias voltage $V_{DD}$ and to a common node with a capacitor that is coupled to ground, said common node being coupled to one of said inductors.

6. The system of claim 1, wherein said output device comprises a buffer.

7. A method, comprising:
    generating a plurality of oscillating signals utilizing a plurality of voltage controlled oscillators (VCOs) arranged adjacent to each other, each of said plurality of VCOs being operable to generate an output signal at a configurable frequency;
    selectively coupling one of said VCOs to an impedance matching circuit by enabling a respective driver coupled to each of the plurality of VCOs;
    matching an impedance of each of the plurality of VCOs to an output device utilizing impedance matching elements coupled to the drivers, wherein said output device comprises a prescaler that is an integer or fractional-N frequency divider;
    providing an output signal at a desired frequency using said output device coupled to said impedance matching elements; and
    configuring said drivers to provide a constant output power no matter which of said plurality of VCOs is enabled.

8. The method of claim 7, wherein said impedance matching elements comprise capacitors and inductors.

9. The method of claim 8, wherein between each adjacent pair of said respective drivers coupled to each of the plurality of VCOs, the impedance matching elements comprise two inductors coupled in series between the drivers and a capacitor coupled to ground and to a common node between the two inductors.

10. The method according to claim 8, wherein impedance values of said capacitors and inductors are configurable.

11. The method of claim 8, wherein said impedance matching elements comprise a resistor coupled to a bias voltage $V_{DD}$ and to a common node with a capacitor that is coupled to ground, said common node being coupled to one of said inductors.

12. The method of claim 7, wherein said output device comprises a buffer.

13. A system, comprising:
    a plurality of voltage controlled oscillators (VCOs) arranged adjacent to each other, each of said plurality of VCOs being operable to generate an output signal at a configurable frequency;
    an impedance matching circuit comprising a respective driver coupled to each of the plurality of VCOs and configurable inductors and capacitors coupled to said drivers;
    a resistor coupled to a bias voltage $V_{DD}$ and to a common node with a capacitor that is coupled to ground, said common node being coupled to one of said configurable inductors; and
    an output device coupled to the impedance matching circuit, wherein said respective drivers coupled to each of said plurality of VCOs are configured to provide a constant output power no matter which of the plurality of VCOs is enabled.

14. The system of claim 13, wherein between each adjacent pair of said respective drivers coupled to each of said plurality of VCOs, the configurable inductors and capacitors comprise two inductors coupled in series between the drivers and a capacitor coupled to ground and to a common node between the two inductors.

15. A system, comprising:
    a plurality of voltage controlled oscillators (VCOs) arranged adjacent to each other, each of said plurality of VCOs being operable to generate an output signal at a configurable frequency;
    an impedance matching circuit comprising a respective driver and impedance matching elements coupled to each of the plurality of VCOs, wherein said impedance matching elements comprise capacitors and inductors and a resistor coupled to a bias voltage $V_{DD}$ and to a common node with a capacitor that is coupled to ground, said common node being coupled to one of said inductors; and
    an output device coupled to the impedance matching circuit, wherein said respective drivers coupled to each of the plurality of VCOs are configured to provide a constant output power no matter which of said plurality of VCOs is enabled.

16. The system of claim 15, wherein between each adjacent pair of said respective drivers coupled to each of the plurality of VCOs, the impedance matching elements comprise two inductors coupled in series between the drivers and a capacitor coupled to ground and to a common node between the two inductors.

17. The system of claim 15, wherein impedance values of said capacitors and inductors are configurable.

18. The system of claim 15, wherein said output device comprises a buffer.

19. A system, comprising:
    a plurality of voltage controlled oscillators (VCOs) arranged adjacent to each other, each of said plurality of VCOs being operable to generate an output signal at a configurable frequency;
    an impedance matching circuit comprising a respective driver and impedance matching elements coupled to each of the plurality of VCOs; and
    an output device coupled to the impedance matching circuit, wherein said output device comprises a buffer, wherein said respective drivers coupled to each of the plurality of VCOs are configured to provide a constant output power no matter which of said plurality of VCOs is enabled.

20. The system of claim 19, wherein said impedance matching elements comprise capacitors and inductors.

21. The system of claim 19, wherein between each adjacent pair of said respective drivers coupled to each of the plurality of VCOs, the impedance matching elements comprise two inductors coupled in series between the drivers and a capacitor coupled to ground and to a common node between the two inductors.

22. The system of claim 19, wherein impedance values of said capacitors and inductors are configurable.

23. The system of claim 19, wherein said respective drivers coupled to each of the plurality of VCOs are configured to provide a constant output power no matter which of said plurality of VCOs is enabled.

24. A system, comprising:
a plurality of voltage controlled oscillators (VCOs) arranged adjacent to each other, each of said plurality of VCOs being operable to generate an output signal at a configurable frequency;
an impedance matching circuit comprising a respective driver and impedance matching elements coupled to each of the plurality of VCOs, wherein said impedance matching elements comprise capacitors and inductors and a resistor coupled to a bias voltage $V_{DD}$ and to a common node with a capacitor that is coupled to ground, said common node being coupled to one of said inductors; and
an output device coupled to the impedance matching circuit, wherein said respective drivers coupled to each of the plurality of VCOs are configured to provide a constant output power no matter which of said plurality of VCOs is enabled.

25. The system of claim 24, wherein between each adjacent pair of said respective drivers coupled to each of the plurality of VCOs, the impedance matching elements comprise two inductors coupled in series between the drivers and a capacitor coupled to ground and to a common node between the two inductors.

26. The method according to claim 24, wherein impedance values of said capacitors and inductors are configurable.

27. The system of claim 24, wherein said output device comprises a buffer.

28. A method, comprising:
generating a plurality of oscillating signals utilizing a plurality of voltage controlled oscillators (VCOs) arranged adjacent to each other, each of said plurality of VCOs being operable to generate an output signal at a configurable frequency;
selectively coupling one of said VCOs to an impedance matching circuit by enabling a respective driver coupled to each of the plurality of VCOs;
matching an impedance of each of the plurality of VCOs to an output device utilizing impedance matching elements coupled to the drivers, wherein said output device comprises a buffer;
providing an output signal at a desired frequency using said output device coupled to said impedance matching elements, and configuring said drivers to provide a constant output power no matter which of said plurality of VCOs is enabled.

29. The method of claim 28, wherein said impedance matching elements comprise capacitors and inductors.

30. The method of claim 28, wherein between each adjacent pair of said respective drivers coupled to each of the plurality of VCOs, the impedance matching elements comprise two inductors coupled in series between the drivers and a capacitor coupled to ground and to a common node between the two inductors.

31. The method according to claim 28, wherein impedance values of said capacitors and inductors are configurable.

32. A method, comprising:
generating a plurality of oscillating signals utilizing a plurality of voltage controlled oscillators (VCOs) arranged adjacent to each other, each of said plurality of VCOs being operable to generate an output signal at a configurable frequency;
selectively coupling one of said VCOs to an impedance matching circuit by enabling a respective driver coupled to each of the plurality of VCOs;
matching an impedance of each of the plurality of VCOs to an output device utilizing impedance matching elements coupled to the drivers; and
providing an output signal at a desired frequency using said output device coupled to said impedance matching elements, wherein said drivers are configured to provide a constant output power no matter which of said plurality of VCOs is enabled.

33. The method of claim 32, wherein said impedance matching elements comprise capacitors and inductors.

34. The method of claim 32, wherein between each adjacent pair of said respective drivers coupled to each of the plurality of VCOs, the impedance matching elements comprise two inductors coupled in series between the drivers and a capacitor coupled to ground and to a common node between the two inductors.

35. The method according to claim 32, wherein impedance values of said capacitors and inductors are configurable.

36. A system, comprising:
a plurality of voltage controlled oscillators (VCOs) arranged adjacent to each other, each of said plurality of VCOs being operable to generate an output signal at a configurable frequency;
an impedance matching circuit comprising a respective driver coupled to each of the plurality of VCOs and configurable inductors and capacitors coupled to said drivers; and
an output device coupled to the impedance matching circuit, wherein said respective drivers coupled to each of said plurality of VCOs are configured to provide a constant output power no matter which of the plurality of VCOs is enabled.

37. The system of claim 36, wherein between each adjacent pair of said respective drivers coupled to each of said plurality of VCOs, the configurable inductors and capacitors comprise two inductors coupled in series between the drivers and a capacitor coupled to ground and to a common node between the two inductors.

* * * * *